United States Patent [19]

McNeill

[11] Patent Number: 4,459,543

[45] Date of Patent: Jul. 10, 1984

[54] AUTOMATIC PHASE COMPENSATION CIRCUIT

[75] Inventor: Thomas J. McNeill, Lyndhurst, Ohio

[73] Assignee: Gould Inc., Rolling Meadows, Ill.

[21] Appl. No.: 307,398

[22] Filed: Oct. 1, 1981

[51] Int. Cl.³ .................................................. G01R 25/04
[52] U.S. Cl. ................................ 324/83 R; 324/83 Q; 324/83 A; 324/83 FE
[58] Field of Search ................ 324/83 Q, 83 R, 85, 324/79 R, 83 D, 83 FE, 83 FM, 130, 73 AT, 74, 233, 225

[56] References Cited

U.S. PATENT DOCUMENTS

| | | | |
|---|---|---|---|
| 3,244,987 | 4/1966 | Prapis et al. | 328/166 |
| 3,249,868 | 5/1966 | Sheftelman | 324/83 |
| 3,278,847 | 10/1966 | Widenor | 324/83 |
| 3,491,289 | 1/1970 | Petini | 324/233 |
| 3,701,012 | 10/1972 | Lang | 324/79 R |
| 3,757,214 | 9/1973 | Kaufman | 324/83 Q |
| 3,806,802 | 4/1974 | Hamlet | 324/83 Q |
| 3,922,602 | 11/1975 | Lunquist | 324/83 Q |
| 3,986,113 | 10/1976 | Vifian | 324/85 |
| 4,005,358 | 1/1977 | Foner | 324/233 |
| 4,120,229 | 10/1978 | Ota | 84/454 |
| 4,122,391 | 10/1978 | Harp | 324/78 |
| 4,156,183 | 5/1979 | Schuon | 324/77 A |
| 4,414,852 | 11/1983 | McNeill | 73/765 |

Primary Examiner—Michael J. Tokar
Assistant Examiner—B. J. Kelley
Attorney, Agent, or Firm—John R. Garrett

[57] ABSTRACT

An automatic phase compensation circuit is disclosed for use with carrier transducers. A quadrature oscillator drives the carrier transducer and provides phase reference and quadrature reference signals to a phase shifter. The phase shifter provides phase shifted reference signals. The return signal from the carrier transducer is separately demodulated with respect to each of the phase shifted reference signals. The demodulated signal with respect to the phase shifted quadrature reference signal is converted into a DC control signal which controls the amount of the phase shift of the phase shifter. The phase shifter receives the quadrature reference signal into a variable gain amplifier controlled by the DC control signal. The output of the variable gain amplifier is summed with the phase reference signal. The resultant summation is a phase shifted reference signal with the control signal controlling the amount of phase shift. The phase shifter reference signal is fed into a constant gain amplifier which outputs the phase shifted phase reference signal. A 90° phase shifter generates a phase shifted quadrature reference signal. The return signal demodulated with respect to the phase shifted phase reference signal will be the full magnitude of the return signal independant of the phase shift of the carrier transducer.

10 Claims, 10 Drawing Figures

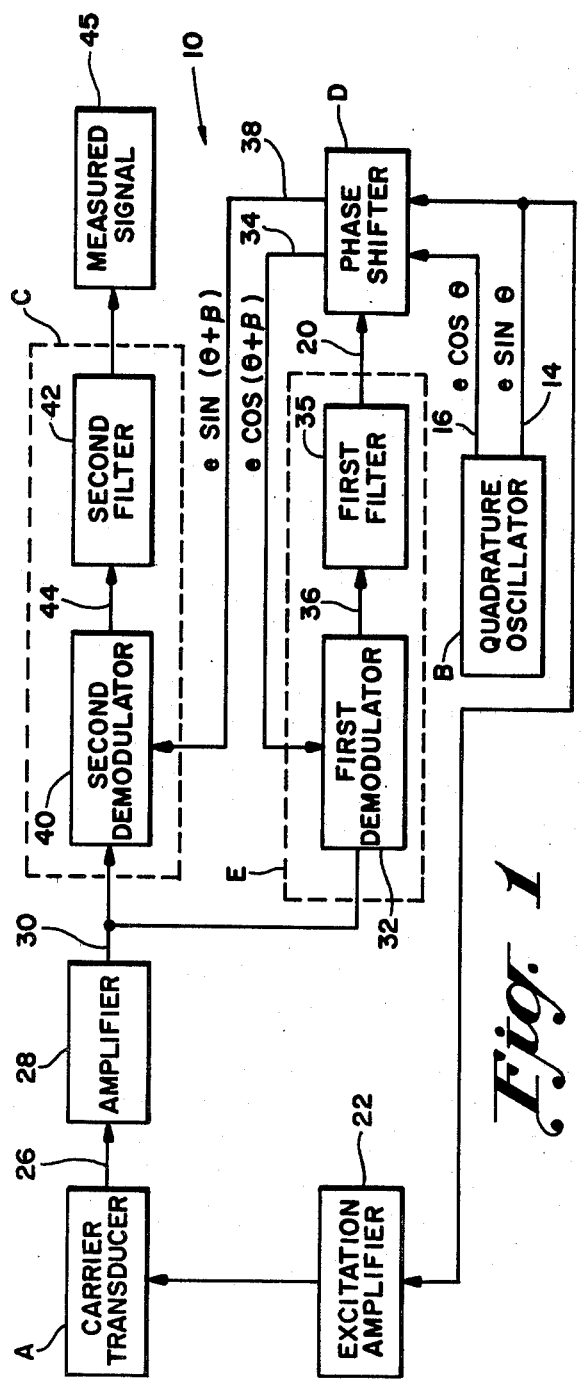
Fig. 1
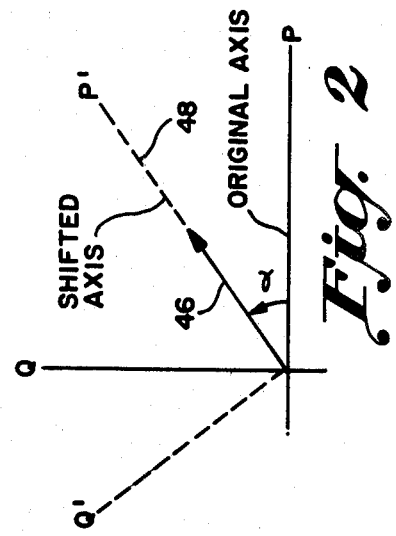
Fig. 2
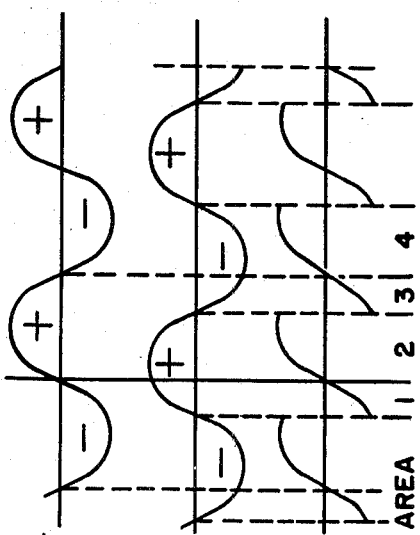
Fig. 3a
Fig. 3b
Fig. 3c

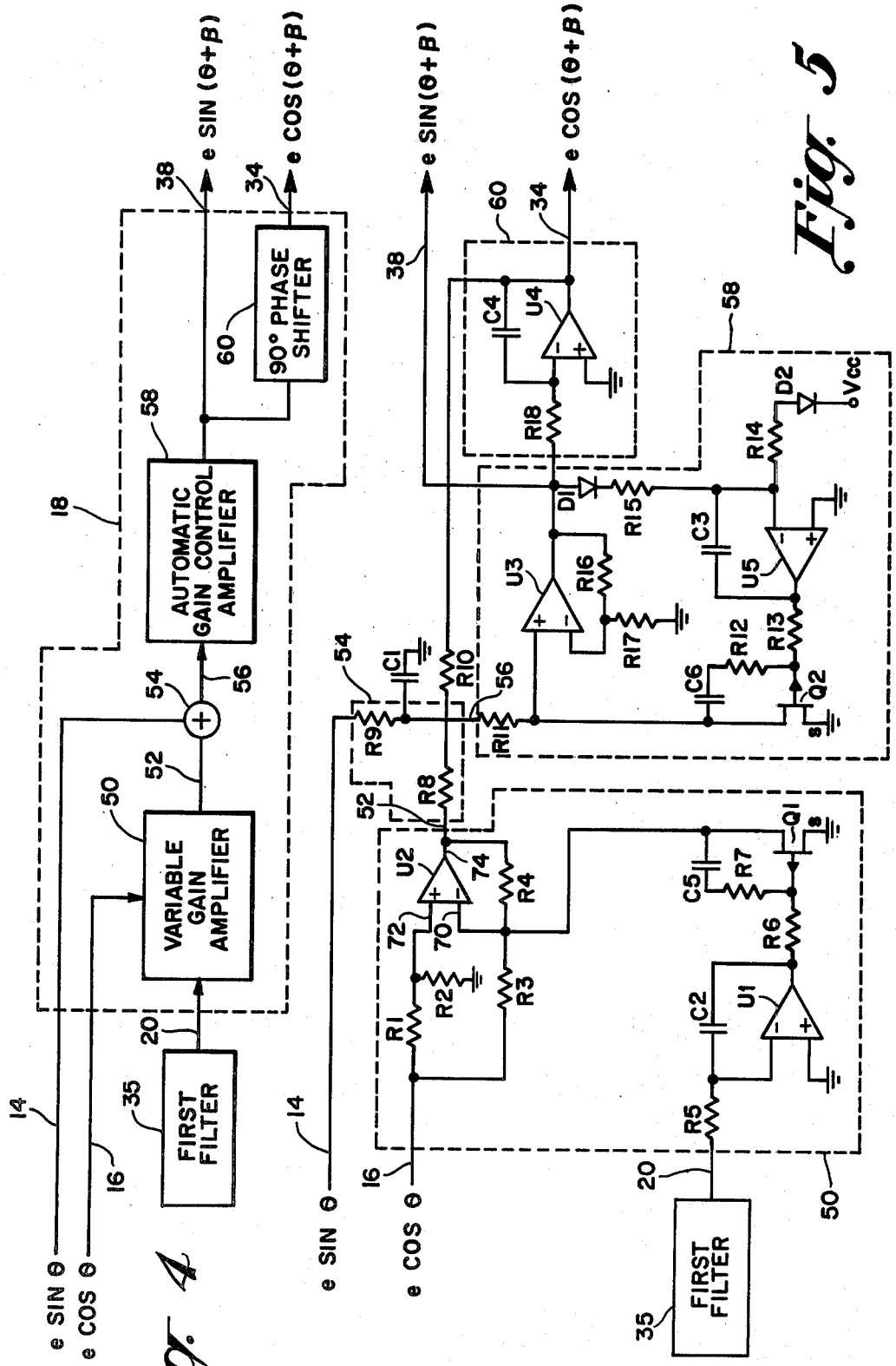

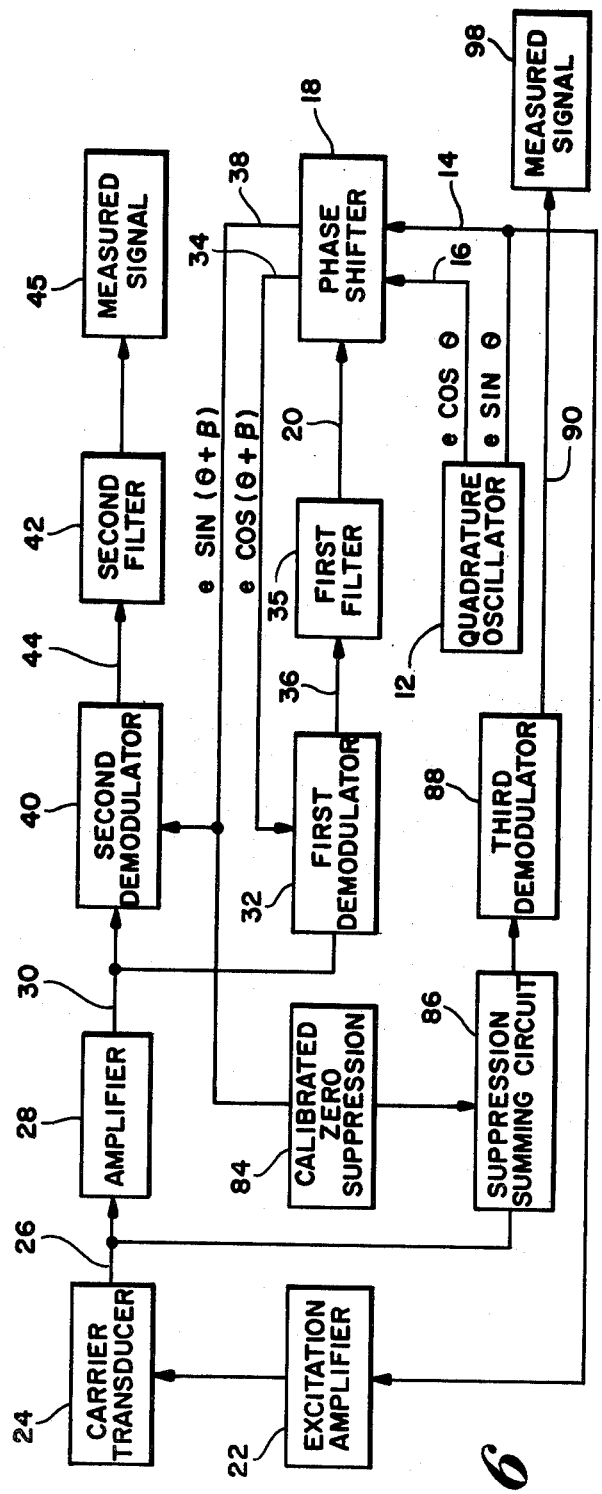
Fig. 6
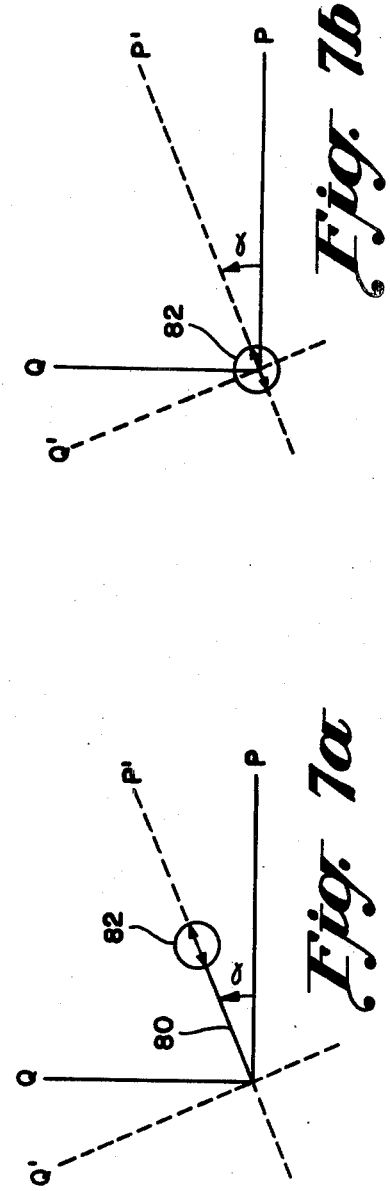
Fig. 7a
Fig. 7b

AUTOMATIC PHASE COMPENSATION CIRCUIT

TECHNICAL FIELD

The present invention relates to measuring circuits and is more particularly directed to an automatic phase compensation circuit for use with carrier type transducers.

BACKGROUND ART

Carrier type transducers are known in the art. These transducers may take the form of resistive bridges or linear voltage differential transformers. These type of transducers are excited by a sinusoidal drive signal. When the transducer is subjected to force or stress, an AC return signal is produced which is proportional to the amount of displacement experienced by the transducer.

For example, a resistive bridge transducer may be placed on a beam in order to measure the beam flexure. The resistor values of the bridge are typically selected so that the output signal from the transducer will be zero volts AC when the beam is in an unloaded condition. Once the beam is flexed, an AC return signal is produced proportional to the amount of the overall flexure.

In order to determine the significance of the transducer return signal, the return signal is measured with respect to the sinusoidal drive signal of the transducer. Unfortunately, several factors will typically cause the transducer return signal to exhibit a phase shift relative to the sinusoidal drive signal when the transducer is subjected to force. Such factors include stray capacitance in the lead lines leading up to the transducer or stray capacitance in the transducer itself.

The return signal from the transducer is typically measured with respect to the sinusoidal drive signal. The return signal can be considered to be a vector which can be plotted on a Cartesian coordinate system. The X-axis represents the sinusoidal drive signal which is known in the art as the phase axis. The Y-axis represents a sinusoidal signal 90° out of phase with respect to the X-axis. The Y-axis is known in the art as a quadrature axis. Since the return signal is out of phase with respect to the sinusoidal drive signal, the return signal vector typically will lie between the phase and the quadrature axis. The measure of the return signal with respect to the sinusoidal drive signal will therefore be only an indication of the X-component of the return signal vector and not the full value of the vector magnitude.

As those skilled in the art will appreciate, varying phase shifts due to the above-mentioned factors will cause inconsistent results for return signals having the same magnitudes. The phase shift also causes inconsistent readings to occur when a different transducer is substituted which exhibits a different phase shift or the length of the lead lines are altered.

An object of the present invention is to provide a new and improved phase compensation circuit wherein the inherent reactance of transducers and associated electrical components, tending to create an output signal phase shifted with respect to a reference signal, are automatically compensated.

Another object of the present invention is to provide an automatic phase compensation circuit that will automatically zero the average return signal to permit measurements of amplitude fluctuations about the average zero value.

DISCLOSURE OF THE INVENTION

The invention provides an automatic phase compensation circuit particularly adapted for use with carrier type transducers. The new automatic phase compensation circuit is designed to shift the sinusoidal reference signal used by the output circuit prior to measuring the return signal from the test circuit, thereby measuring the full magnitude of the return signal. Another feature of the invention is that the value of the measured signal will be independent of the amount of phase shift of the return signal with respect to the sinusoidal drive signal in the test circuit system.

The automatic phase compensation circuit of the invention comprises a reference generator for generating a phase reference signal and a quadrature reference signal. The phase reference signal provides a sinusoidal drive source for the test circuit. A phase shifter is provided having a variable gain amplifier operatively coupled to the quadrature reference signal and to a control signal. The control signal controls the gain of the variable gain amplifier. A summing means is operatively coupled to the variable gain amplifier and to a phase reference signal for summing the phase reference signal and the output of the variable gain amplifier. The resultant summation is a phase shifted phase reference signal. A 90° phase shifter is operatively coupled to the summing means for producing a phase shifted quadrature reference signal. A first demodulation means is operatively coupled to the return signal and to the phase shifted quadrature reference signal for demodulating the return signal with respect to the phase shifted quadrature reference signal and for producing the control signal indicative of the demodulated signal. A second demodulation means is operatively coupled to the return signal and to the phase shifted phase reference signal for demodulating the return signal with respect to the phase shifted phase reference signal and for producing an output signal indicative thereof.

A feature of the invention is that the phase shifter utilizes a variable gain amplifier to control the amount of phase shift of the reference signal. The original phase reference signal and a variable amount of the quadrature reference signal are internally summed within the phase shifter. The amount of the quadrature reference signal being summed is determined by the amount of phase shift between the drive signal and the return signal from the test circuit. The resultant internal summation of the phase reference signal and the quadrature reference signal is a phase shifted reference signal which is in phase with the return signal. The phase shifted reference signal from the phase shifter is used as the new reference signal for the demodulator that measures the return signal from the test circuit.

Another feature of the present invention is the utilization of FET's as variable resistors to control the gain of the amplifier within the phase shifter circuit.

Still another feature of the present invention is the provision for utilizing a calibrated zero suppression circuit to subtract a given amount from the return signal of the test circuit to shift the average magnitude to a zero value position of the measuring coordinate system.

Other features and advantages and a fuller understanding of the invention will be had from the following detailed description and the accompanying drawings.

BRIEF DESCRIPTION OF THE DRAWINGS

FIG. 1 is a block diagram of the preferred embodiment of the present invention.

FIG. 2 is vectorial depiction of the return signal shown on the shifted measurement axis.

FIGS. 3A–3C are graphical depictions of the operation of the demodulators.

FIG. 4 is a block diagram of the phase shifter.

FIG. 5 is a schematical diagram of the phase shifter.

FIG. 6 is a block diagram of another embodiment of the present invention, and

FIGS. 7A and 7B are graphical depictions of the operation of the embodiment shown in FIG. 6.

BEST MODE FOR CARRYING OUT THE INVENTION

Referring now to FIG. 1, a carrier transducer A is driven by one sinusoidal drive reference signal from an oscillator B. The return signal from transducer A is a sinusoidal wave, shifted in phase with respect to the sinusoidal drive signal, with magnitude proportional to the displacement experienced by the transducer. An output circuit C measures the return signal from transducer A with respect to a reference signal. In order to measure the true magnitude of the return signal, the reference signal used by circuit C must be in phase with respect to the return signal. A phase shifter D generates two phase shifted reference signals. The output circuit C uses one of these phase shifted reference signals as its reference. A control circuit E monitors the return signal from transducer A and controls the amount of phase shift in the phase shifter D.

In order to better understand the operation of the invention, a more detailed explanation is now given.

Referring again to FIG. 1, an automatic phase compensation circuit 10 has a sinusoidal reference oscillator B also known in the art as a quadrature oscillator. Quadrature oscillator B produces a phase reference signal 14 and a quadrature reference signal 16.

The phase reference signal is a sinusoidal wave. The quadrature reference signal is identical to the phase reference signal except that it is 90° out of phase with respect thereto.

The phase reference signal may also be designated as the sine reference signal and the quadrature reference signal may also be designated as the cosine reference signal. The value of the phase reference signal 14 is equal to e sin $\theta$ and the value of the quadrature reference signal 16 is equal to e cos $\theta$.

The quadrature oscillator B is operatively coupled to phase shifter D. Phase shifter D receives the two reference signals from quadrature oscillator B and generates two phase shifted reference signals therefrom. The amount of the phase shift is determined by a control signal 20 received by the phase shifter D.

The phase reference signal 14 of quadrature oscillator B is operatively coupled to an excitation amplifier 22. Excitation amplifier 22 is operatively coupled to the test circuit or carrier transducer A. It is the amplified phase reference signal from oscillator B that powers the carrier transducer A.

The present invention contemplates the use of any type of carrier transducer known in the art such as resistive bridge strain gages, linear voltage differential transformers having an internal movable slug, etc. If the quadrature oscillator B were to generate a phase reference signal having sufficient drive capabilities, it will be appreciated that excitation amplifier 22 would not be essential. However, the utilization of excitation amplifier 22 also provides a certain amount of isolation for the quadrature oscillator B.

The carrier transducers A produces a return signal 26. The return signal 26 from carrier transducer A is a sinusoidal signal whose amplitude varies according to the amount of displacement experienced by the transducer A. The return signal is typically measured with respect to the drive signal. The problem with carrier transducers of this type is that the return signal 26 is shifted in phase with respect to the drive signal or the phase reference signal from the quadrature oscillator B. If the return signal 26 is measured with respect to the phase reference signal from quadrature oscillator B, different readings occur for return signals having the exact same amplitudes but differing amounts of phase shift. Such problems arise when different transducers are used in the same system, different length lead lines are used in the system, etc. The present invention measures the full value or magnitude of the return signal 26 independent of the phase shift within the carrier transducer system.

Carrier transducer A is operatively coupled to an amplifier 28. Amplifier 28 is used to amplify the return signal 26 from carrier transducer A. The use of the amplifier improves the sensitivity of the overall measuring system. As those skilled in the art will appreciate, the return signal 26 from carrier transducer A may be of sufficient amplitude to measure adequately in which case amplifier 28 would not be needed. As mentioned above, the output signal to be measured 30 will typically be shifted in phase with respect to the phase reference signal from quadrature oscillator 12. The amount of the phase shift can be designated as $\alpha$. The output signal 30 can be expressed as:

$$e_x \sin(\theta + \alpha)$$

where $e_x$ is proportional to the variation in the physical parameter of the carrier transducer 24, $\theta$ is proportional to the phase reference signal and $\alpha$ is the transducer phase shift.

The return signal is monitored by a control circuit E. More specifically, the output signal 30 is operatively coupled to and is received by a first demodulator 32. First demodulator 32 demodulates the output signal 30 with respect to a phase shifted quadrature reference signal 34 from phase shifter D. The phase shifted quadrature signal 34 from phase shifter D can be expressed as:

$$e \cos(\theta + \beta)$$

where $\beta$ is equal to the amount of phase shift which phase shifter D has shifted the quadrature reference signal 16.

First demodulator 32 is operatively coupled to first filter 35. First filter 35 filters the output signal 36 of first demodulator 32 into a DC signal. The DC signal from first filter 34 is the control signal 20 which controls the amount of phase shift in phase shifter D.

Phase shifter D also outputs a phase shifted phase reference signal 38. The phase shifted phase reference signal 38 can be expresed as:

$$e \sin(\theta + \beta)$$

The output signal 30 is operatively coupled to an output circuit C which measures and analyzes the return signal. The output circuit C measures the return signal with respect to another modulated wave. In order to measure the true magnitude of the return signal, the reference signal used by circuit C must be in phase with the return signal. Specifically second demodulator 40 is operatively coupled to the phase shifted phase reference signal 38 from phase shifter D and to the output signal 30. Second demodulator 40 demodulates the return signal with respect to the phase shifted phase reference signal. Second filter 42 is operatively coupled to second demodulator 40 and filters the output signal 44 from the second demodulator 40 into a DC signal. The output of the second filter 42 will be the measured signal 45 which will be the true value of the return signal 30 independent of the phase shift in the carrier transducer system.

In order to better appreciate the operation of the present invention, the workings of the demodulators and the phase shifter will be explained in greater detail. Referring now to FIG. 2, the return signal can be shown as a vector 46 plotted on a quadrature vs. a phase graph. The amount of phase shift in the return signal was designated above as $\alpha$. The intent of the invention is to in essence "shift the measuring axis" 48 Q' and P', to align with the vector 46 so that the measured output signal 45 will be the true magnitude of the vector 46 along the P' axis with the quadrature component along Q' being completely cancelled.

Referring now to FIG. 3 which applies to both first modulator 32 and second modulator 42, FIG. 3a represents the phase shifted reference signal which the demodulator uses as its basis for the demodulation. FIG. 3b represents the input signal into the demodulator which is phase shifted by an amount designated above as $\alpha$. The lines in FIG. 3c represent the resultant output of the demodulator. Referring now to FIG. 3c, and in particular to area 1, the reference signal in line 3a is in the negative quadrant while the received signal in FIG. 3b is in the positive quadrant. Multiplying the signs of these two quadrants, one being plus and one being minus yields a minus. Therefore the output of the demodulator will be a portion of a sinusoidal wave in the negative region in area 1. In area 2, both the reference signal and the received return signal are in the positive quadrant. A positive times a positive yields a positive and the output of the demodulator will be a portion of a sinusoidal wave in the positive quadrant in area 2. In area 3, the reference signal is in the positive quadrant and the received return signal is in the negative quadrant. Therefore the output of the demodulator will be a portion of a sinusoidal wave in the negative quadrant in area 3. In area 4, both the reference signal and the received return signal are in the negative quadrant. Therefore a negative times a negative will yield a positive and the output of the demodulator will be a portion of a sinusoidal wave in the positive quadrant in area 4. Those skilled in the art will appreciate that the output of the second demodulator can be the measured signal without need for filtering.

Referring specifically now to first demodulator 32, the phase shifted quadrature reference signal 34 is equal to:

$$e \cos(\theta + \beta)$$

and the received return signal 30 is equal to $$e_x \sin(0 + \theta + a).$$

The output of the demodulator 32 can be expressed as $$e_o = \frac{2}{2\pi} e_x \int_{90 + \beta}^{270 + \beta} \sin(\theta + a) d\theta$$

which can be expressed as $$e_o = \frac{e_x}{\pi} \int_{90 + \beta}^{270 + \beta} [\cos a \sin \theta + \sin a \cos \theta] d\theta$$

Taking the integral yields $$e_o = \frac{2e_x}{\pi} [\cos a \sin \beta - \sin a \cos \beta]$$

which can be reduced to $$e_o = \frac{2e_x}{\pi} \sin(\beta - a)$$

This signal is then received by first filter 35 which filters the signal to a DC control signal 20. The purpose of the phase shifter 18 is to force $$\beta = a$$

at which time $$e_o = 0$$

and the feedback loop becomes stable. Since $$\beta = a$$

the phase shifted phase reference signal 38 can be expressed either $$e \sin(\theta + a)$$

or $$e \sin(\theta + \beta).$$

Since the received signal 30 is $$e_x \sin(\theta + a)$$

second demodulator 10 will demodulate this signal with respect to the phase shifted phase reference signal $$e \sin(\theta + a)$$

which can be measured if so desired. The output signal from the second filter 42 will thus be $$(\pi/2) e_x$$

Thus the measured signal 45 will be proportional to the physical parameter being measured in the carrier transducer 24 and will be independent of the transducer phase shift.

Referring now to FIGS. 4 and 5, the operation of the phase shifter D can be better appreciated. FIG. 4 shows a block diagram of the phase shifter D. Phase reference signal 14 and quadrature reference signal 16 are received by the phase shifter D. Quadrature reference signal 16 is operatively coupled to variable gain amplifier 50. Variable gain amplifier is also operatively coupled to first filter 34 to receive the control signal 20. The control signal 20 controls the amount of gain of variable gain amplifier 50. The output signal 52 from variable gain amplifier 50 will be a cosine wave with varying amplitude which is dependent on the gain of the amplifier 50. Summing circuit 54 is operatively coupled to the output 52 of variable gain amplifier 50 and to the phase reference signal 14 of quadrature oscillator B. As those skilled in the art will appreciate, the output signal 56 from summing circuit 54 will be a sine wave shifted in phase with respect to the phase reference signal 14. The amount of the phase shift will be determined by the amount of output signal 52 from variable gain amplifier 50 being summed with the phase reference signal. Automatic gain control amplifier 58 is operatively coupled to output 56 of summing circuit 54. The purpose of automatic gain control amplifier 58 is for producing an output signal from phase shifter D that will be of constant amplitude. The output signal 38 of phase shifter D as explained above, is expressed as $$e \sin (\theta + \beta).$$

A 90° phase shifter 60 is provided to shift the output from automatic gain control amplifier 58 by 90° thus generating an output 34 which as explained above can be expressed as $$e \cos (\theta + \beta)$$

Referring now to FIG. 5, a specific implementation of the concept shown in FIG. 4 is provided. The quadrature reference signal 16 is received by variable gain amplifier 50. Resistors R1 and R2 act as a voltage divider. Resistors R3 and R4 also act as voltage dividers. As those skilled in the art will appreciate, operational amplifier U2 will produce a voltage necessary to make the voltage level at input 70 equal to that of input 72. An FET, Q1 is operatively coupled to the input 70 of operational amplifier U2. As the resistance of Q1 changes, the output 74 of operational amplifier U2 will vary to maintain the same voltage at input 70 as is present at input 72. First filter 35 produces the control signal 20 that ultimately controls the resistance of Q1. Control signal 20 is received by variable gain amplifier 50 through the integrator network made up of components R5, C2 and U1. Components R6, R7 and Q1 provide a variable resistance at input 70 such that the resultant output 52 of variable gain amplifier 50 will be controlled by the control signal from first filter 34. The components of variable gain control amplifier 50 are preferably chosen such that the output 52 will yield a gain between +1 and −1 such that the output signal value will vary from $$+e \cos \theta.$$

to $$-e \cos \theta$$

The summing circuit 54 sums the output signal 52 of variable gain amplifier 50 with the phase reference control signal 14 through resistors R8 and R9 respectively.

The output voltage for the resultant voltage summation 56 is equal to $$e_2 \sin (\theta + \beta)$$

where $e_2$ varies from $$e_1 \text{ to } \sqrt{2} \ e,$$

and $\beta$ varies from 0 to $\pm 45°$ depending on the gain of the variable gain control amplifier 50. The automatic gain control amplifier 58 provides a constant amplitude output of the summation results from the summing circuit 54. The output of U3 which is designated 38 is $$e \sin (\theta + \beta)$$

while the output of U4 which forms the 90° phase shifter 60 is $$e \cos (\theta + \beta).$$

As those skilled in the art will appreciate, U3 and U4 in conjunction form an amplifier with feedback through resistor R10. The amplifier gain is stabilized through U5. The operation of the circuitry for the stabilizing circuit having U5 utilizes the variable resistance of the FET Q2. As explained above, the resultant phase shifted reference signal is phase shifted an amount equal to $\beta$ which is equal to the amount of the phase shift $\alpha$ from the carrier transducer A.

Since the second demodulator 40 demodulates the return signal 30 with respect to the phase shifted phase reference signal, it is apparent from FIG. 2 that the return signal measured is the true value or full magnitude since the measurement axis "has been rotated" by an amount equal to the phase shift from the carrier transducer 24.

While the automatic phase shifter circuit D shown in FIG. 5 may be constructed from any suitable electrical components, the present invention has been constructed and successfully operated utilizing components having the following values or designations:

| Resistors: | OHMS |
|---|---|
| R1 | 100K |
| R2 | 1.3K |
| R3 | 200K |
| R4 | 200K |
| R5 | 20K |
| R6 | 100K |
| R7 | 100K |
| R8 | 25.465K |
| R9 | 25.465K |
| R10 | 25.465K |
| R11 | 24K |
| R12 | 100K |
| R13 | 100K |
| R14 | 20K |
| R15 | 10K |
| R16 | 100K |
| R17 | 1.3K |
| R18 | 6.366K |
| Capacitors | Micro Farads |
| C1 | .01 |
| C2 | 1 |
| C3 | 10 |
| C4 | .01 |
| C5 | .1 |
| C6 | .1 |
| Diodes | Type |
| D1 | IN4148 |

| | | |
|---|---|---|
| D2 | IN4148 | |
| Operational Amplifiers | Type | |
| U1 | TL084 | |
| U2 | TL084 | |
| U3 | TL084 | |
| U4 | TL084 | |
| U5 | TL084 | |
| Field Effect Transistors | Type | |
| Q1 | 2N5033 | |
| Q2 | 2N5033 | |

Another embodiment of the present invention is shown in FIGS. 6 and 7. Referring to FIG. 7a, the output 26 of carrier transducer 24 can be represented as a vector 80. The block diagram shown in FIG. 6 initially "rotates the measurement axis" so that the vector will align with the phase axis P'. Certain utilizations of specific type of carrier transducers may yield an output vector 80 that has a varying magnitude within the area shown in circle 82. In such a case, it is desirable to eliminate the average value of the magnitude of the output vector 80 such that the oscillating portion will be centered around the zero position of the coordinate system.

In order to accomplish this, a calibrated zero suppression circuit 84 is provided which is operatively coupled to the phase shifted phase reference signal 38. The calibrated zero suppression circuit 84 is operatively coupled to a suppression amplifier 86. The suppression amplifier 86 is operatively coupled to output 26 of carrier transducer 24. The suppression amplifier 86 sums or subtracts the output signal from the calibrated zero suppression circuit with or from the return signal of the carrier transducer. Since the calibrated zero suppression circuit output signal and the carrier transducer output signal are synchronized, as much of the magnitude of vector 80 can be subtracted as is desirable. It is preferable that the average magnitude value be subtracted.

The resultant summation from suppression amplifier 86 is operatively coupled to a third demodulator 88 which demodulates the resultant summation or subtraction with respect to the phase shifted phase reference signal. The output 90 is a signal indicative of the resultant summation or subtraction within the suppression amplifier 86.

Referring now to FIG. 7b, if the entire average value of vector 80 is completely subtracted by the calibration suppression circuit 84, the encircled portion 82 is centered around the zero axis position. It is contemplated that this type of zero suppression circuit would be extremely helpful in certain recorders such as strip chart recorders in which the variation portion can be centered around the zero axis position and the sensitivity of the measuring instrument increased. The remaining variations will thus be within the limits of the recording device.

Under certain conditions, it may be desirable to only measure the variations within the area 82. In such a case, second demodulator 40 and second filter 42 would not be needed.

Other modifications and variations of the invention will be apparent to those skilled in the art in view of the foregoing detailed disclosure. Therefore, it is to be understood that, within the scope of the appended claims, the invention can be practiced otherwise than as specifically shown and described.

I claim:

1. An automatic phase compensation circuit for measuring a return signal from a test device, said phase compensation circuit comprising:
   a reference generator for generating a phase reference signal and a quadrature reference signal, said phase reference signal providing a drive means for said test device;
   a phase shifter having a variable gain amplifier operatively coupled to said quadrature reference signal and a control signal, said control signal controlling the gain of said variable gain amplifier, a summing means operatively coupled to said variable gain amplifier and said phase reference signal for summing the phase reference signal and the output of said variable gain amplifier, the resultant summation being a phase shifted phase reference signal, and a 90° phase shifter operatively coupled to said summing means for generating a phase shifted quadrature reference signal;
   a first demodulation means operatively coupled to said return signal and said phase shifted quadrature reference signal for demodulating said return signal with respect to said phase shifted quadrature reference signal and for generating said control signal indicative of the demodulated signal; and
   a second demodulation means operatively coupled to said return signal and to said phase shifted phase reference signal for demodulating said return signal with respect to said phase shifted phase reference signal and for generating a signal indicative thereof.

2. The automatic phase compensation circuit of claim 1 wherein said first demodulation means includes a demodulator and a filter operatively coupled to said demodulator, said filter filtering the demodulated signal into a DC level, said DC level being said control signal.

3. The automatic phase compensation circuit of claim 1 wherein said variable gain amplifier includes an operational amplifier and an FET operatively coupled to said control signal and to said operational amplifier, changes in said control signal varying the resistance of said FET and in turn varying the gain of said operational amplifier.

4. An automatic phase compensation circuit for measuring a return signal from a test device, said phase compensation circuit comprising:
   a reference generator for generating a phase reference signal and a quadrature reference signal, said phase reference signal providing a drive means for said test device;
   a phase shifter including, an operational amplifier operatively coupled to said quadrature reference signal, an FET operatively coupled to a control signal and to said operational amplifier, said control signal varying the resistance of said FET causing the gain of said operational amplifier to change, summing circuit operatively coupled to said operational amplifier and to said phase reference signal for summing the output of said operational amplifier with said phase reference signal, said summation defining a phase shifted phase reference signal, an automatic gain control amplifier operatively coupled to said summing circuit to generate a constant amplitude phase shifted phase refrence signal, and a 90° phase shifter operatively coupled to said automatic gain control amplifier to generate a phase shifted quadrature reference signal;

a first demodulation means operatively coupled to said return signal and to said phase shifted quadrature reference signal for demodulating said return signal with respect to said phase shifted quadrature reference signal and for generating said control signal indicative of the demodulated signal; and a second demodulation means operatively coupled to said return signal and to said phase shifted phase reference signal for demodulating said return signal with respect to said phase shifted phase reference signal and for generating a signal indicative thereof.

5. An automatic phase compensation circuit for measuring a return signal from a test device, said phase compensation circuit comprising:

a reference generator for generating a phase reference signal and a quadrature reference signal, said phase reference signal providing a drive means for said test device;

a phase shifter operatively coupled to said reference generator and a control signal, said phase shifter generating a phase shifted phase reference signal and a phase shifted quadrature reference signal, the amount of the phase shift being controlled by said control signal;

a first demodulator operatively coupled to said return signal and to said phase shifted quadrature reference signal, said first demodulator demodulating said return signal with respect to said phase shifted quadrature reference signal;

a first filter operatively coupled to said first demodulator, said first filter filtering the demodulated return signal with respect to said phase shifted quadrature reference signal into a DC level, said DC level being said control signal;

a second demodulator operatively coupled to said return signal and to said phase shifted phase reference signal, said second demodulator demodulating said return signal with respect to said phase shifted phase reference signal; and a second filter operatively coupled to said second demodulator, said second filter filtering the demodulated return signal with respect to said phase shifted phase reference signal into a DC level defining a measured signal;

said phase shifter having a variable gain amplifier and a summing circuit, said summing circuit summing a variable amount of said quadrature reference signal with said phase reference signal to generate said phase shifted phase reference signal, the amount of quadrature reference signal being controlled by said control signal, said phase shifter further including a 90° phase shifter operatively coupled to said summing circuit to output said phase shifted quadrature reference signal.

6. An automatic phase compensation and suppression circuit for measuring the variations in a return signal from a test device, said circuit comprising:

a reference generator for generating a phase reference signal and a quadrature reference signal, said phase reference signal providing a drive means to said test device;

a phase shifter operatively coupled to said reference generator and a control signal said phase shifter generating a phase shifted phase reference signal and a phase shifted quadrature reference signal, the amount of the phase shift being controlled by said control signal;

a first demodulation means operatively coupled to said return signal and to said phase shifted quadrature reference signal for demodulating said return signal with respect to said phase shifted quadrature reference signal and for generating said control signal indicative of said demodulated signal;

a calibrated zero suppression circuit operatively coupled to said phase shifted phase reference signal for generating variable amplitude, a modulated signal synchronized with said phase shifted phase reference signal;

a suppression summing circuit operatively coupled to said calibrated zero suppression circuit and said return signal, said suppression summing circuit summing the return signal with the signal from said calibrated suppression circuit to cancel at least a portion of the magnitude of said return signal; and a second demodulation means operatively connected to said phase shifted phase reference signal and to said suppression summing circuit for demodulating the resultant signal from said suppression summing circuit with respect to said phase shifted phase reference signal.

7. The automatic phase compensation and suppression circuit of claim 6 wherein said phase shifter includes, a variable gain amplifier operatively coupled to said quadrature reference signal and said control signal, said control signal controlling the gain of said variable gain amplifier, a summing means operatively coupled to said variable gain control amplifier and said phase reference signal for summing the phase reference signal and the output of said variable gain amplifier, the resultant summation being said phase shifted phase reference signal, and a 90° phase shifter operatively coupled to said summing means for generating a phase shifted quadrature reference signal.

8. The automatic phase compensation and suppression circuit of claim 7 wherein said variable gain amplifier includes an operational amplifier and an FET operatively coupled to said control signal and to said operational amplifier, changes in said control signal varying the resistance of said FET and in turn varying the gain of said operational amplifier.

9. An automatic phase compensation circuit for measuring a return signal from a test device, said phase compensation circuit comprising:

(a) an oscillator having a phase and a quadrature output, said phase output operatively coupled to the test device;

(b) an output circuit operatively coupled to said test device for measuring and analyzing said return signal;

(c) a phase shifter operatively coupled to said oscillator and said output circuit for producing phase shifted phase and quadrature reference signals, said phase shifter having:

(i) a variable gain amplifier operatively coupled to said quadrature output;

(ii) summing means operatively coupled to said variable gain amplifier and said phase output for summing the output of the amplifier and the phase output together, the result being said phase shifted phase reference signal;

(iii) a 90° phase shifter operatively coupled to said summing means for producing said phase shifted quadrature reference signal; and (d) a control circuit operatively coupled to said test device and said phase shifter for measuring and analyzing said return signal with respect to said phase shifted quadrature reference signal, said control circuit controlling the variable gain amplifier;

(e) said output circuit measuring and analyzing said return signal with respect to said phase shifted phase reference signal.

10. An automatic phase compensation circuit for measuring a return signal from a test device, said phase compensation circuit comprising:

(a) an oscillator having a phase and a quadrature output, said phase output operatively coupled to the test device;

(b) an output circuit operatively coupled to said test device for measuring and analyzing said return signal;

(c) a phase shifter operatively coupled to said oscillator and said output circuit for producing phase shifted phase and quadrature reference signals, said phase shifter having:

(i) a variable gain amplifier operatively coupled to said quadrature output;

(ii) summing means operatively coupled to said variable gain amplifier and said phase output for summing the output of the amplifier and the phase output together, the result being said phase shifted phase reference signal;

(iii) an automatic gain control amplifier operatively coupled to said summing means for generating a phase shifted phase reference output signal of constant amplitude;

(iv) a 90° phase shifter operatively coupled to said automatic gain control amplifier for producing said phase shifted quadrature reference signal; and (d) a control circuit operatively coupled to said test device and said phase shifter for measuring and analyzing said return signal with respect to said phase shifted quadrature reference signal, said control circuit controlling the variable gain amplifier;

(e) said output circuit measuring and analyzing said return signal with respect to said phase shifted phase reference signal.

* * * * *

UNITED STATES PATENT AND TRADEMARK OFFICE
CERTIFICATE OF CORRECTION

PATENT NO. : 4,459,543

DATED : July 10, 1984

INVENTOR(S) : Thomas J. McNeill

It is certified that error appears in the above-identified patent and that said Letters Patent are hereby corrected as shown below:

Col. 4, line 61, delete "34" and insert therefor --35--.

Col. 6, line 2, delete "$e_x \sin(0+\theta+\alpha)$." and insert therefor --$e_x \sin(\theta+\alpha)$.--.

line 60, delete "$(\tau/2)e_x$" and insert therefor --$(\pi/2)e_x$--.

Col. 7, line 5, delete "34" and insert therefor --35--.

UNITED STATES PATENT AND TRADEMARK OFFICE
CERTIFICATE OF CORRECTION

PATENT NO. : 4,459,543
DATED     : July 10, 1984
INVENTOR(S) : Thomas J. McNeill It is certified that error appears in the above-identified patent and that said Letters Patent are hereby corrected as shown below:

Col. 7, line 60, delete ".".

Col. 7, line 64 after "-e cos θ" insert --.--.

Signed and Sealed this

Sixteenth Day of April 1985

[SEAL]

Attest:

DONALD J. QUIGG

Attesting Officer     Acting Commissioner of Patents and Trademarks